(12) United States Patent
Lee

(10) Patent No.: US 12,057,804 B2
(45) Date of Patent: Aug. 6, 2024

(54) SOLAR MODULE INSTALLATION METHOD FOR EFFICIENT USE OF SUNLIGHT

(71) Applicant: SUNG CHANG CO., LTD, Chungcheongbuk-do (KR)

(72) Inventor: Jae Jin Lee, Chungcheongbuk-do (KR)

(73) Assignee: SUNG CHANG CO., LTD, Chungcheongbuk-do (KR)

(*) Notice: Subject to any disclaimer, the term of this patent is extended or adjusted under 35 U.S.C. 154(b) by 1065 days.

(21) Appl. No.: 16/960,348

(22) PCT Filed: Aug. 28, 2018

(86) PCT No.: PCT/KR2018/009895
§ 371 (c)(1),
(2) Date: Jul. 7, 2020

(87) PCT Pub. No.: WO2019/142993
PCT Pub. Date: Jul. 25, 2019

(65) Prior Publication Data
US 2020/0373883 A1 Nov. 26, 2020

(30) Foreign Application Priority Data
Jan. 16, 2018 (KR) .................. 10-2018-0005599

(51) Int. Cl.
H02S 40/22 (2014.01)
G06F 7/548 (2006.01)
(Continued)

(52) U.S. Cl.
CPC .............. *H02S 40/22* (2014.12); *G06F 7/548* (2013.01); *G06F 30/13* (2020.01); *H02S 20/00* (2013.01); *H02S 99/00* (2013.01)

(58) Field of Classification Search
CPC .......... H02S 40/22; H02S 20/00; H02S 99/00; H02S 20/30; G06F 7/548; G06F 30/13; Y02E 10/52; Y02E 10/50
See application file for complete search history.

(56) References Cited

FOREIGN PATENT DOCUMENTS

JP    H11-330523 A    11/1999
JP    2002-026363      1/2002
(Continued)

OTHER PUBLICATIONS

International Search Report from corresponding PCT Application No. PCT/KR2018/009895, dated Dec. 6, 2018.

*Primary Examiner* — Michael Y Sun
(74) *Attorney, Agent, or Firm* — Harness, Dickey & Pierce, P.L.C.

(57) ABSTRACT

A solar module installation method for efficient use of sunlight according to the present invention comprises the steps of: determining a reflection panel inclination angle of a solar reflection panel such that the panel is inclined by a predetermined angle with respect to a virtual horizontal plane; calculating a second projection distance by using a first projection height, a second projection height, and a first projection distance; and determining a panel inclination angle between the solar panel and a second virtual horizontal plane or determining the length of the solar panel so that the other end of the solar panel is positioned at the calculated second projection distance, and installing a solar module according to the determined panel inclination angle or panel length.

7 Claims, 4 Drawing Sheets

(51) Int. Cl.
*G06F 30/13* (2020.01)
*H02S 20/00* (2014.01)
*H02S 99/00* (2014.01)

(56) References Cited

FOREIGN PATENT DOCUMENTS

| | | | | |
|---|---|---|---|---|
| KR | 10-1032515 | B1 | 5/2011 | |
| KR | 10-1612426 | B1 | 4/2016 | |
| KR | 10-2017-0034978 | A | 3/2017 | |
| WO | WO-2012115378 | A2 * | 8/2012 | ......... H01L 31/0547 |
| WO | WO-2015160053 | A1 * | 10/2015 | ............ H02S 40/22 |

* cited by examiner

SOLAR MODULE INSTALLATION METHOD FOR EFFICIENT USE OF SUNLIGHT

CROSS-REFERENCE TO RELATED APPLICATIONS

This application is a national phase application of PCT Application No. PCT/KR2018/009895, filed on Aug. 28, 2018, which claims the benefit and priority to Korean Patent Application No. 10-2018-0005599, filed on Jan. 16, 2018. The entire disclosures of the applications identified in this paragraph are incorporated herein by references.

FIELD

The present invention relates to solar photovoltaic power generation, and more particularly, to a method of installing a sunlight module including a sunlight panel and a sunlight reflection plate for reflecting sunlight.

BACKGROUND

Generally, solar photovoltaic power generation refers to obtaining electrical energy by condensing incident sunlight using plate-shaped condensing panels which are laterally and longitudinally arranged. Recently, importance of alternative energy has significantly come to the fore due to exhaustion of petroleum and a variety of energies or increases in cost. As an example, a solar photovoltaic power generation system using sunlight has been required.

Such a solar photovoltaic power generator generally includes a sunlight module formed by connecting solar cell plates in parallel or in a series to receive necessary power, a storage battery configured to store condensed power, a power regulator configured to regulate power, a DC/AC inverter, and the like. Here, the sunlight module includes a sunlight panel configured to condense sunlight and a sunlight reflection plate configured to reflect sunlight toward the sunlight panel.

However, according to a related art, since an altitude of the sun varies according to a change of season, all sunlight incident on the sunlight reflection plate may not be transferred to the sunlight panel. That is, since an angle at which the sunlight reflection plate is coupled to the sunlight panel is not regular and the sunlight reflection plate and the sunlight panel are not installed such that the corresponding coupling angle satisfies a meridian altitude of the sun, solar photovoltaic power generation efficiency of the sunlight module is not high.

SUMMARY

Technical Problem

The present invention is directed to providing a method of installing a sunlight module for efficient use of sunlight, in which an optimal panel tilt angle or panel length of sunlight panels included in the sunlight module is determined to install the sunlight module.

Technical Solution

One aspect of the present invention provides a method of installing a sunlight module to efficiently use sunlight. The method includes determining, by a sunlight module including a sunlight panel and a sunlight reflection plate, a reflection plate tilt angle of the sunlight reflection plate so as to be tilted at a certain angle with a first virtual horizontal surface including a tangent according to a connection between one panel end of the sunlight panel and one reflection plate end of the sunlight reflection plate when the tangent is being horizontal, calculating a second projection distance corresponding to a distance between a second reference point and a second projection point at which a second virtual horizontal surface meets sunlight which is reflected by another reflection plate end and projected onto the second virtual horizontal surface by using a first projection height corresponding to a distance between the other reflection plate end of the sunlight reflection plate and a first reference point which meets a vertical line vertically extending from the other reflection plate end to be perpendicular to the first virtual horizontal surface, a second projection height corresponding to a distance between the other reflection plate end and the second reference point which meets the second virtual horizontal surface horizontally extending from another panel end of the sunlight panel, and a first projection distance corresponding to a distance between the first reference point and a first projection point at which the first virtual horizontal surface meets the sunlight which is reflected by the other reflection plate end and projected onto the first virtual horizontal surface, and determining a panel tilt angle between the sunlight panel and the second virtual horizontal surface or determining a length of the sunlight panel to allow the other panel end of the sunlight panel to be located at the calculated second projection distance and installing the sunlight module corresponding to the determined panel tilt angle or panel length.

The determining of the reflection plate tilt angle may include determining an angle corresponding to a meridian altitude of the sun at the summer solstice among twenty four seasonal divisions as the reflection plate tilt angle.

The calculating of the second projection distance may include calculating the second projection distance using a proportional relationship among the first projection height, the second projection height, the first projection distance, and the second projection distance.

The calculating of the second projection distance may include calculating the second projection distance in consideration that the sunlight is projected onto the sunlight reflection plate on the basis of the winter solstice at which the meridian altitude of the sun is lowest among twenty four seasonal divisions.

The first projection height may be calculated using a trigonometric function based on a reflection plate length and the reflection plate tilt angle of the sunlight reflection plate.

The first projection distance may be calculated using a trigonometric function based on the first projection height and a projection angle of the sunlight with respect to the first virtual horizontal surface or the second virtual horizontal surface at the winter solstice.

The projection angle may be calculated using the following Equation.

$$\text{Projection angle} = 180° + \text{meridian altitude of sun at winter solstice} - 2*\text{meridian altitude of sun at summer solstice} \quad [\text{Equation}]$$

Advantageous Effects

According to the present invention, in a sunlight module including a sunlight panel and a sunlight reflection plate, a tilt angle of the sunlight panel may be determined or a length of the sunlight panel may be determined using a relationship among a first projection height, a second projection height, a first projection distance, and a second projection distance of sunlight so as to maximally transfer the sunlight to the sunlight panel regardless of a change in a meridian altitude of the sun so that the sunlight is efficiently used.

DETAILED DESCRIPTION

Hereinafter, exemplary embodiments of the present invention will be described in detail with reference to the attached drawings.

Figure 1:
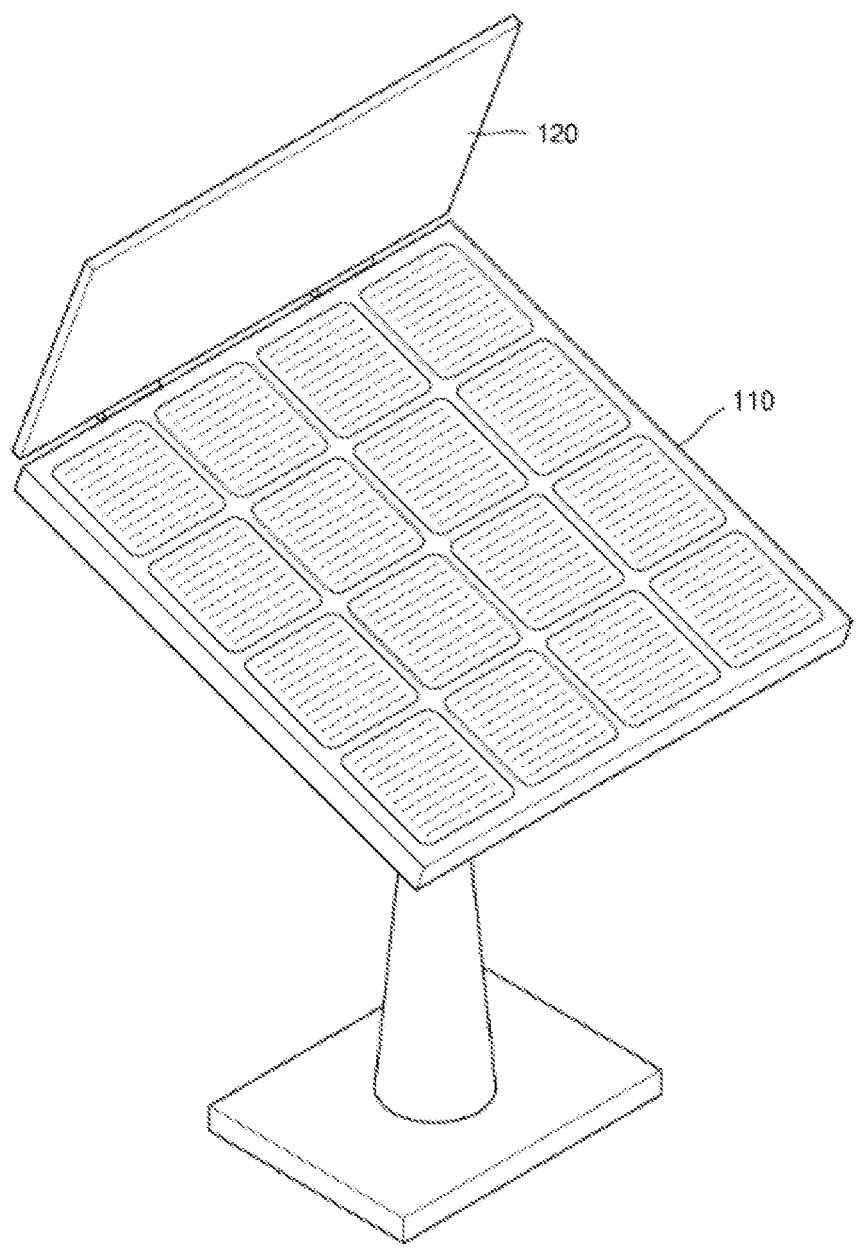
FIG. 1 is a reference view illustrating one embodiment of a structure of a sunlight module according to the present invention.

FIG. 1 is a reference view illustrating one embodiment of a structure of a sunlight module 100 according to the present invention.

Referring to FIG. 1, the sunlight module 100 may include a sunlight panel 110 and a sunlight reflection plate 120.

In the sunlight panel 110, a solar cell converts condensed sunlight into electrical energy. To this end, the sunlight panel 110 includes toughened glass, the solar cell, a back sheet, and the like. The toughened glass is configured to allow sunlight to be incident therethrough and is installed on an outer surface of a top of the sunlight panel. The toughened glass includes a low-iron flat shape. Solar cells correspond to photoelectric cells configured to convert solar photovoltaic energy into electrical energy and may be classified into a silicon solar cell, a compound semiconductor solar cell, and the like. For example, the solar cell is a thin silicon crystal plate and has one surface to which infinitesimal phosphorus is attachable. In the solar cell, when sunlight is emitted, as free electrons of silicon move, an electromotive force may be generated and convert sunlight into electrical energy. The back sheet may be provided as a protection layer at a bottom of the solar cell.

The sunlight reflection plate 120 is manufactured using a metal material such as mirror aluminum, mirror stainless steel, and the like which has a high reflexibility and excellent heat conductivity. The sunlight reflection plate 120 may be coated with a reflective metal material to improve reflexibility. The sunlight reflection plate 120 may be disposed one side or both sides of the sunlight panel 110. The sunlight reflection plate 120 reflects incident sunlight toward the sunlight panel 110. Accordingly, sunlight reflected by the sunlight reflection plate 120 is incident on the sunlight panel 110 in addition to sunlight self-incident on the sunlight panel 110 such that the sunlight reflection plate 120 performs a function of increasing efficiency of condensing the sunlight.

One panel end of the sunlight panel 110 comes into contact with one reflection plate end of the sunlight reflection plate 120 and a bolt and a nut, which are fastening means, are fastened to a bolt insertion hole such that the sunlight reflection plate 120 may be connected to the sunlight panel 110. Since an incident angle of sunlight varies depending on season or the time of day, efficiency of solar photovoltaic power generation may be degraded. Accordingly, to maximally receive sunlight even when an incident angle of the sunlight varies according to season, it is necessary to determine a coupling angle between the sunlight reflection plate 120 and the sunlight panel 110 or a length of the sunlight panel.

Figure 2:
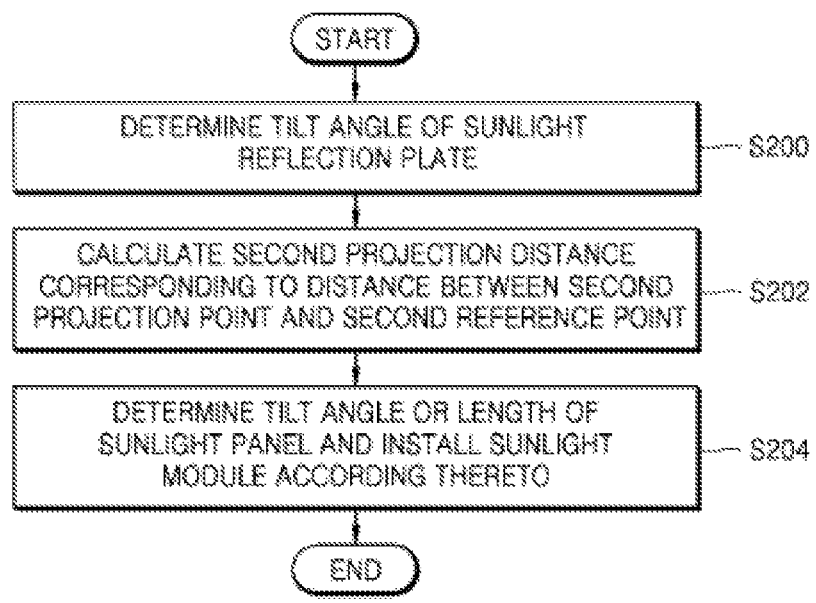
FIG. 2 is a flowchart illustrating one embodiment of a method of installing the sunlight module for efficient use of sunlight according to the present invention.

FIG. 2 is a flowchart illustrating one embodiment of a method of installing the sunlight module for efficient use of sunlight according to the present invention.

In the sunlight module including the sunlight panel and the sunlight reflection plate, a reflection plate tilt angle of the sunlight reflection plate is determined so as to be tilted at a certain angle with a first virtual horizontal surface including a tangent according to a connection between the one panel end of the sunlight panel and the one reflection plate end of the sunlight reflection plate when the tangent is being horizontal (S200).

Figure 3:
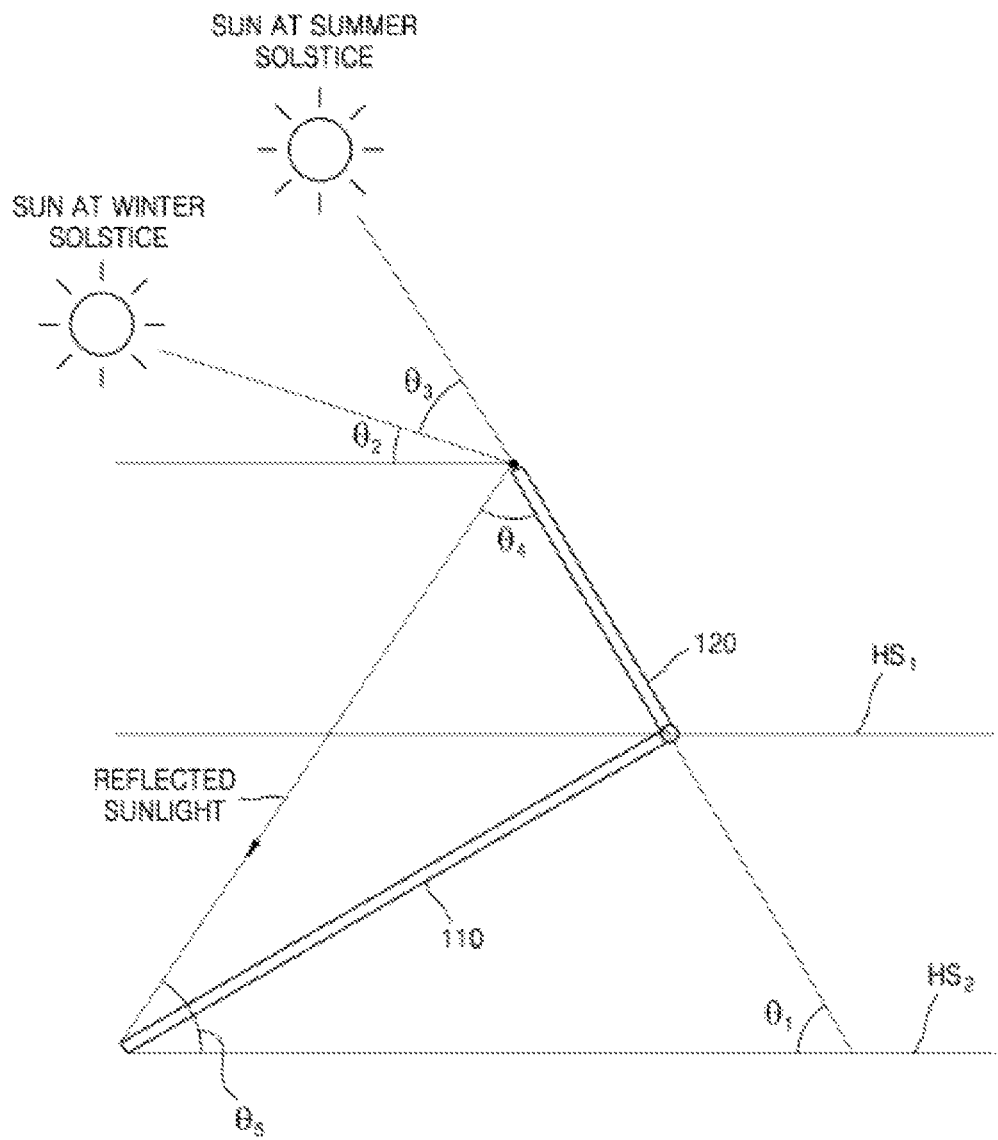
FIG. 3 is a reference view illustrating one embodiment of a relationship between the sunlight panel shown in FIG. 1 and a meridian altitude of the sun.

FIG. 3 is a reference view illustrating one embodiment of a relationship between the sunlight panel 110 shown in FIG. 1 and a meridian altitude of the sun. FIG. 3 is a reference view illustrating the sunlight being projected onto the sunlight reflection plate on the basis of the summer solstice at which the meridian altitude of the sun is highest and the winter solstice at which the meridian altitude of the sun is lowest among twenty four seasonal divisions.

Referring to FIG. 3, the meridian altitude of the sun at the summer solstice is $\theta_1$ and the meridian altitude of the sun at the winter solstice is $\theta_2$. Accordingly, an angle $\theta_3$ may satisfy following Equation 1.

Meridian altitude of sun at summer solstice
$\theta_1$=Meridian altitude of sun at winter solstice
$\theta_2+\theta_3$ [Equation 1]

Meanwhile, when it is assumed that sunlight is totally reflected by the sunlight reflection plate 120, it is satisfied that the angle $\theta_3=\theta_4$. Accordingly, on the basis of a definition in which a sum of interior angles of a triangle is 180°, a projection angle $\theta_5$ formed between the sunlight being reflected by the sunlight reflection plate 120 and a first virtual horizontal surface $HS_1$ or a second virtual horizontal surface $HS_2$ may be defined as following Equation 2.

$$\begin{aligned} \text{Projection angle } \theta_5 &= 180° - (\text{Meridian altitude of sun at summer solstice } \theta_1 + \theta_4) \\ &= 180° - (\text{Meridian altitude of sun at summer solstice } \theta_1 + \theta_3) \\ &= 180° - (\text{Meridian altitude of sun at summer solstice } \theta_1 - \theta_2) \\ &= 180° + \text{Meridian altitude of sun at winter solstice } \theta_2 - 2*\text{meridian altitude of sun at summer solstice } \theta_1 \end{aligned}$$ [Equation 2]

Here, the first virtual horizontal surface $HS_1$ may be defined as a surface including a tangent according to a connection between the one panel end of the sunlight panel 110 and the one reflection plate end of the sunlight reflection plate 120 when the tangent is being horizontal. Also, the second virtual horizontal surface $HS_2$ may be defined as a surface which horizontally extends from the other panel end of the sunlight panel 110.

For example, according to Equation 2, the projection angle $\theta_5=180°+29°-2*76°=57°$ with respect the first virtual horizontal surface $HS_1$ or the second virtual horizontal surface $HS_2$ of sunlight when the meridian altitude of the sun at the summer solstice is $\theta_1=76°$ and the meridian altitude of the sun at the winter solstice $\theta_2=29°$ may be calculated according to Equation 2.

After operation S200, a second projection distance corresponding to a distance between a second reference point and a second projection point at which a second virtual horizontal surface meets sunlight which is reflected by another reflection plate end and projected onto the second virtual horizontal surface is calculated by using a first projection height corresponding to a distance between the other reflection plate end of the sunlight reflection plate and a first reference point which meets a vertical line vertically extending from the other reflection plate end to be perpendicular to a first virtual horizontal surface, a second projection height corresponding to a distance between the other reflection plate end and the second reference point which meets the second virtual horizontal surface horizontally extending from another panel end of the sunlight panel, and a first projection distance corresponding to a distance between the first reference point and a first projection point at which the first virtual horizontal surface meets the sunlight which is reflected by the other reflection plate end and projected onto the first virtual horizontal surface (S202).

Figure 4:
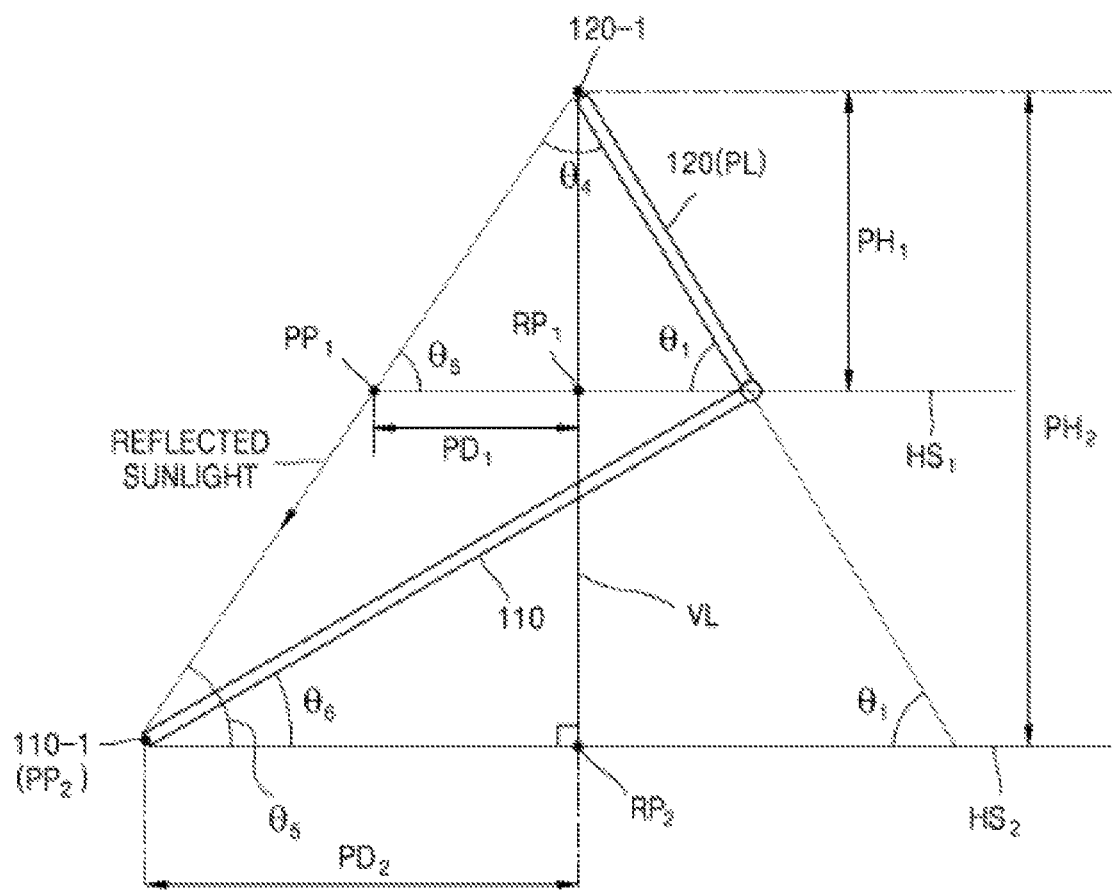
FIG. 4 is a reference view illustrating one embodiment of an angular relationship according to coupling between the sunlight panel and a sunlight reflection plate shown in FIG. 3.

FIG. 4 is a reference view illustrating one embodiment of an angular relationship according to coupling between the sunlight panel 110 and the sunlight reflection plate 120 shown in FIG. 3.

Referring to FIG. 4, a distance between another reflection plate end 120-1 and a first reference point $RP_1$ which meets a vertical line VL extending from the other reflection plate end 120-1 of the sunlight reflection plate 120 to be perpendicular to the first virtual horizontal surface $HS_1$ may be defined as a first projection height $PH_1$. Also, when a point at which the vertical line VL meets the second virtual horizontal surface $HS_2$ horizontally extending from another panel end 110-1 is referred to as a second reference point $RP_2$, a distance between the second reference point $RP_2$ and the other reflection plate end 120-1 may be defined as a second projection height $PH_2$. Also, a point at which sunlight meets the first virtual horizontal surface $HS_1$ when the sunlight is reflected by the other reflection plate end 120-1 and projected onto the first virtual horizontal surface $HS_1$ may be defined as a first projection point $PP_1$. Also, a point at which sunlight meets the second virtual horizontal surface $HS_2$ when the sunlight is reflected by the other reflection plate end 120-1 and projected onto the second virtual horizontal surface $HS_2$ may be defined as a second projection point $PP_2$. Also, a distance between the first projection point $PP_1$ and the first reference point $RP_1$ which have been defined above may be defined as a first projection distance $PD_1$, and a distance between the second projection point $PP_2$ and the second reference point $RP_2$ may be defined as a second projection distance $PD_2$.

The second projection distance $PD_2$ may be calculated using a relationship according to the above definitions. Here, the second projection distance $PD_2$ may be calculated in consideration that sunlight is projected onto the sunlight reflection plate 120 on the basis of winter solstice at which the meridian altitude of the sun is lowest among twenty four seasonal divisions.

First, the first projection height $PH_1$ may be calculated using a trigonometric function based on a reflection plate length PL and a reflection plate tilt angle $\theta_1$ of the sunlight reflection plate 120. For example, when the reflection plate length PL of the sunlight reflection plate 120 is L and the reflection plate tilt angle $\theta_1$ is 76° corresponding to the meridian altitude of the sun at the summer solstice, a value of the first projection height $PH_1$, that is, $L*\sin 76°$ may be calculated.

Also, the first projection distance $PD_1$ may be calculated using a trigonometric function based on the projection angle $\theta_5$ of the sunlight at the winter solstice with respect to the first virtual horizontal surface $HS_1$ and the first projection height $PH_1$. For example, when the projection angle $\theta_5$ of the sunlight at the winter solstice with respect to the first virtual horizontal surface $HS_1$ is 57° and the first projection height $PH_1$ is $L*\sin 76°$ as described above, it is satisfied that $\tan 57°=$first projection height $PH_1$/first projection distance $PD_1=L*\sin 76°$/first projection distance $PD_1$. Accordingly, a value of the first projection distance $PD_1=L*\sin 76°/\tan 57°$ may be calculated.

Subsequently, the second projection distance $PD_2$ may be calculated using a proportional relationship among the first projection height $PH_1$, the second projection height $PH_2$, the first projection distance $PD_1$, and the second projection distance $PD_2$. Here, the second projection height $PH_2$ may be a predetermined constant value. For example, when the first projection height $PH_1$ is $L*\sin 76°$, the second projection height $PH_2$ is a predetermined constant value C, and the first projection distance $PD_1$ is $L*\sin 76°/\tan 57°$, a proportional relationship among the first projection height $PH_1$: the second projection height $PH_2=$the first projection distance $PD_1$: the second projection distance $PD_2$ is validated. Accordingly, a value of second projection distance $PD_2=$first projection distance $PD_1*$(second projection height $PH_2$/first projection height $PH_1$)=$(L*\sin 76°/\tan) 57°)*(C/L*\sin 76°)$ may be calculated.

After operation S202, a panel tilt angle between the sunlight panel and the second virtual horizontal surface is determined or a length of the sunlight panel is determined to allow the other panel end of the sunlight panel to be located at the calculated second projection distance, and the sunlight module is installed corresponding to the determined panel tilt angle or panel length (S204).

For example, when the second projection distance $PD_2$ is $(L*\sin 76°/\tan) 57°)*(C/L*\sin 76°)$ as calculated in operation S202, a length SL of the sunlight panel may be determined to allow the other panel end 110-1 of the sunlight panel 110 to be located at the second projection distance $PD_2$, that is, a distance of $(L*\sin 76°/\tan 57°)*(C/L*\sin) 76°$. A panel tilt angle $\theta_6$ between the sunlight panel 110 and the second virtual horizontal surface $HS_2$ may be determined to allow the other panel end 110-1 of the sunlight panel 110 to be located at the distance of $(L*\sin 76°/\tan 57°)*(C/L*\sin 76°)$. The length SL of the sunlight panel or the panel tilt angle $\theta_6$ may be independently determined or complimentarily determined. For example, when the length SL of the sunlight panel is relatively short, the other panel end 110-1 of the sunlight panel 110 may be determined to be located at the second projection distance $PD_2$ by reducing the panel tilt angle $\theta_6$. When the length SL of the sunlight panel is relatively long, the other panel end 110-1 of the sunlight panel 110 may be determined to be located at the second projection distance $PD_2$ by increasing the panel tilt angle $\theta_6$.

When the panel length or panel tilt angle of the sunlight panel 110 is determined, the sunlight panel 110 is installed while the length or tilt angle thereof is adjusted according to the determined panel length or panel tilt angle. Also, the sunlight reflection plate is installed according to the reflection tilt angle determined in operation S200. Accordingly, regardless of variations in the meridian altitude of the sun, sunlight may be maximally transferred to the sunlight panel and the sunlight module 100 may efficiently use the sunlight.

The present invention may be implemented as a software program and be recorded in a certain computer-readable recording medium so as to be applied to a variety of reproduction devices. The variety of reproduction devices may include a personal computer (PC), a laptop PC, a mobile terminal, and the like. For example, the recording medium may include a hard disk, a flash memory, a random-accessible memory (RAM), a read-only memory (ROM), or the like as a type of being embedded in each reproduction device or an optical disc such as a compact disc recordable (CD-R) and a compact disc rewritable (CD-RW), a compact flash card, smart media, a memory stick, or a multimedia card as an external medium.

Although the embodiments of the present invention have been described above, the embodiments disclosed herein are not intended to limit the present invention. The scope of the present invention should be construed by the following claims, and all techniques within an equivalent range thereof should be construed as being included in the scope of the present invention.

What is claimed is:

1. A method of installing a sunlight module to efficiently use sunlight, the method comprising:
    determining, by a sunlight module including a sunlight panel and a sunlight reflection plate, a reflection plate tilt angle of the sunlight reflection plate so as to be tilted at a certain angle with a first virtual horizontal surface including a tangent according to a connection between a first panel end of the sunlight panel and a first reflection plate end of the sunlight reflection plate when the tangent is being horizontal;
    calculating a second projection distance corresponding to a distance between a second reference point and a second projection point at which a second virtual horizontal surface meets sunlight which is reflected by a second reflection plate end of the sunlight reflection plate and projected onto the second virtual horizontal surface by using a first projection height corresponding to a distance between the second reflection plate end of the sunlight reflection plate and a first reference point which meets a vertical line vertically extending from the second reflection plate end to be perpendicular to a first virtual horizontal surface, a second projection height corresponding to a distance between the second reflection plate end and the second reference point which meets the second virtual horizontal surface horizontally extending from a second panel end of the sunlight panel, and a first projection distance corresponding to a distance between the first reference point and a first projection point at which the first virtual horizontal surface meets the sunlight which is reflected by the second reflection plate end and projected onto the first virtual horizontal surface; and
    determining a panel tilt angle between the sunlight panel and the second virtual horizontal surface or determining a length of the sunlight panel to allow the second panel end of the sunlight panel to be located at the calculated second projection distance and installing the sunlight module corresponding to the determined panel tilt angle or panel length.

2. The method of claim 1, wherein the determining of the reflection plate tilt angle comprises determining an angle corresponding to a meridian altitude of the sun at the summer solstice among twenty four seasonal divisions as the reflection plate tilt angle.

3. The method of claim 1, wherein the calculating of the second projection distance comprises calculating the second projection distance using a proportional relationship among the first projection height, the second projection height, the first projection distance, and the second projection distance.

4. The method of claim 1, wherein the calculating of the second projection distance comprises calculating the second projection distance in consideration that the sunlight is projected onto the sunlight reflection plate on the basis of the winter solstice at which the meridian altitude of the sun is lowest among twenty four seasonal divisions.

5. The method of claim 1, wherein the first projection height is calculated using a trigonometric function based on a reflection plate length and the reflection plate tilt angle of the sunlight reflection plate.

6. The method of claim 5, wherein the first projection distance is calculated using a trigonometric function based on the first projection height and a projection angle of the sunlight with respect to the first virtual horizontal surface or the second virtual horizontal surface at the winter solstice.

7. The method of claim 6, wherein the projection angle is calculated using the following Equation:

Projection angle=180°+meridian altitude of sun at winter solstice−2*meridian altitude of sun at summer solstice.

* * * * *